(12) United States Patent
Cheon (10) Patent No.: US 9,502,105 B2
(45) Date of Patent: Nov. 22, 2016

(54) RESISTIVE MEMORY DEVICE, OPERATING METHOD THEREOF, AND SYSTEM HAVING THE SAME

(71) Applicant: SK hynix Inc., Gyeonggi-do (KR)

(72) Inventor: Jun Ho Cheon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 187 days.

(21) Appl. No.: 14/199,723

(22) Filed: Mar. 6, 2014

(65) Prior Publication Data

US 2015/0113213 A1 Apr. 23, 2015

(30) Foreign Application Priority Data

Oct. 23, 2013 (KR) ........................ 10-2013-0126635

(51) Int. Cl.
*G06F 12/00* (2006.01)
*G11C 13/00* (2006.01)
*G11C 11/56* (2006.01)

(52) U.S. Cl.
CPC ....... *G11C 13/0069* (2013.01); *G11C 13/0064* (2013.01); *G11C 11/5678* (2013.01); *G11C 13/0004* (2013.01)

(58) Field of Classification Search
None
See application file for complete search history.

(56) References Cited

U.S. PATENT DOCUMENTS

| 2007/0211537 | A1* | 9/2007 | Park | G11C 16/0483 365/185.22 |
| 2010/0027326 | A1* | 2/2010 | Kim | G11C 13/0069 365/163 |
| 2010/0246246 | A1* | 9/2010 | Kim | G11C 13/004 365/163 |
| 2013/0290620 | A1* | 10/2013 | Fujinami | G11C 7/1072 711/104 |
| 2015/0355854 | A1* | 12/2015 | Song | G06F 3/0619 711/103 |

FOREIGN PATENT DOCUMENTS

KR 1020130043469 4/2013

* cited by examiner

*Primary Examiner* — Baboucarr Faal
(74) *Attorney, Agent, or Firm* — IP & T Group LLP (57) ABSTRACT

A resistive memory device includes a memory cell array including a plurality of resistive memory cells, an address decoder suitable for decoding an address signal and selecting the resistive memory cells, a read/write control circuit suitable for programming data to the memory cell array or reading data from the memory cell array, a voltage generator suitable for generating operation voltages and providing the operation voltages to the address decoder and a controller suitable for controlling the address decoder, the read/write control circuit, and the voltage generator to perform a write operation in response to a write command and a plurality of write data.

20 Claims, 9 Drawing Sheets

RESISTIVE MEMORY DEVICE, OPERATING METHOD THEREOF, AND SYSTEM HAVING THE SAME

CROSS-REFERENCES TO RELATED APPLICATION

The present application claims priority under 35 U.S.C. 119(a) to Korean application number 10-2013-0126635, filed on Oct. 23, 2013, in the Korean Intellectual Property Office, which is incorporated herein by reference in its entirety.

BACKGROUND

1. Technical Field

Various embodiments of the present invention relate to a semiconductor device, and more particularly, to a resistive memory device, an operating method thereof and a system having the same.

2. Related Art

There has been an increasing demand for a memory device which has nonvolatile properties while repetitively performing a read/write operation, and research has been continuously conducted on the memory device.

As a result of the research, a resistive memory device has emerged.

Among a variety of resistive memory devices, a phase change memory device includes a resistance element for storing data and an access element. When the access element is driven through a word line to write data, a write current may be applied to the resistance element from a bit line to change the resistance state of the resistance element into a crystal state (low resistance state) or amorphous state (high resistance state).

The resistance of a phase change material forming the resistance element is increased by various reasons. This is referred to as resistance drift.

More specifically, although a memory cell programmed within a target range of a resistance state, the resistance value of the memory cell gradually increases with time due to resistance drift. Then after a certain time passes, the resistance value of the memory cell may exceed the target resistance range to reach the resistance range of another state. At this time, the memory cell may lose data stored therein, and the length of time that the memory cell may retain the data is referred to as a retention time. When the retention time is too short, a stable operation of the memory device may not be guaranteed.

Figure 1:
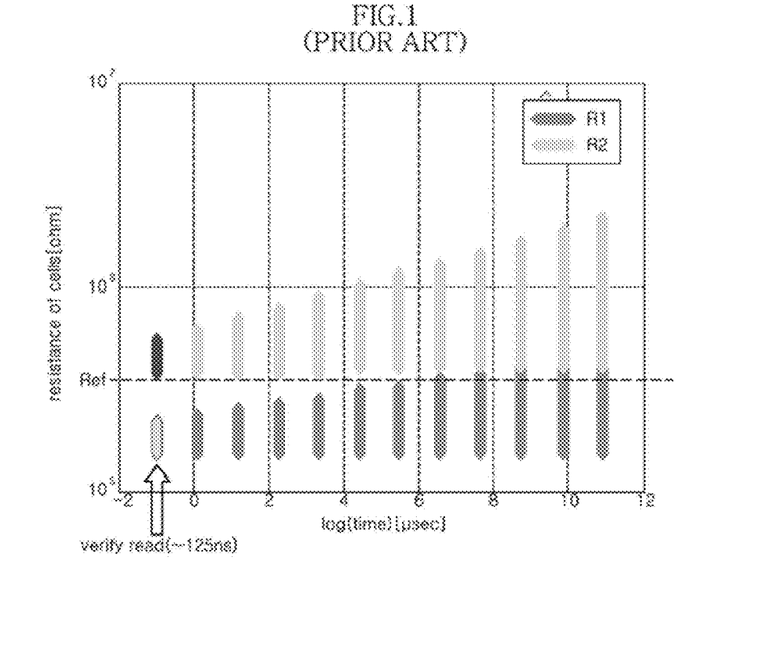
FIG. 1 is a diagram for explaining resistance drift of resistive memory cells in accordance with time.

FIG. 1 is a diagram for explaining resistance drift of resistive memory cells over time.

In general, a resistive memory device writes desired data in a memory cell through a program and verify operation. The program and verify operation indicates an operation of programming data to a memory cell and verifying the programmed data, which is repeated until the resistance value of the memory cell falls within a target range of a resistance state.

FIG. 1 illustrates a case in which memory cells are programmed to have a resistance state R1 or R2 and a verify read operation is performed after about 125 ns. Referring to FIG. 1, it can be seen that the resistances of the memory cells within the target range of the resistance state R1 or R2 increase with time. In particular, resistance drift significantly occurs in the memory cells programmed to have the high resistance state R2.

As the time passes, the resistances of the memory cells programmed to have the resistance state R1 continuously increase. When the resistances of the memory cells exceed reference resistance Ref, the data of the memory cells may not be distinguished by the reference resistance Ref, even though the data were written as the resistance state R1.

Figure 2A:
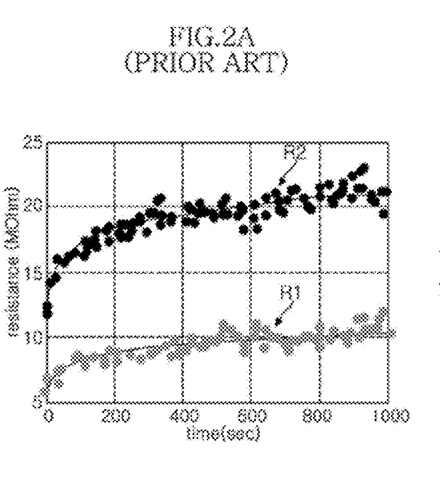
FIGS. 2A and 2B are diagrams for explaining resistance drift of resistive memory cells.
Figure 2B:
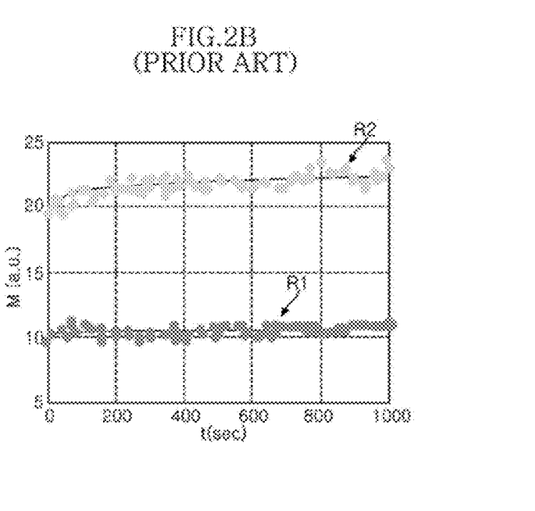

FIGS. 2A and 2B are diagrams for explaining resistance drift of resistive memory cells.

FIG. 2A illustrates resistance changes with the passage of time, and FIG. 2B illustrates voltage changes with the passage of time.

Referring to FIGS. 2A and 2B, it can be seen that resistance is significantly changed immediately after data are written in the memory cells as a resistance state R1 or R2. As such, it is known that the resistance change caused by resistance drift is exponentially proportional to time as expressed by Equation 1 below.

$$R(t) = R(t_0)(t/t_0)^v \qquad \text{[Equation 1]}$$

Here, $t_0$ represents the amount of time elapsed from completion of a write operation to the initial read operation, $R(t_0)$ represents an initial resistance value, v represents a drift coefficient, and t represents the time interval until a resistance value of a resistance element is read after the time $t_0$.

Thus, during a write operation based on the program and verify method, a verify read operation is performed immediately after a program operation, in order to determine a pass or fail of the program operation for a corresponding memory cell. Even though the write operation is completed, the magnitude of the resistance rapidly increases within a very short time, and the time elapsed until reaching a resistance region of another state becomes very short. That is, the retention time of the memory cell inevitably decreases.

A memory cell configured to store two or more-bit data is referred to as a multi-level cell (MLC). Memory devices have been configured with MLCs, in order to increase the capacity of the memory devices.

In order to increase the retention time, a difference between reference resistance values for determining the respective resistance states may be set as a large value. However, when the difference between the reference resistance values is increased, there are difficulties in implementing MLCs capable of storing three or more bits of data. Thus, a method for reducing resistance drift is in demand to implement stable MLCs.

SUMMARY

In an embodiment of the present invention, a resistive memory device includes a memory cell array including a plurality of resistive memory cells, an address decoder suitable for decoding an address signal and selecting the resistive memory cells, a read/write control circuit suitable for programming data to the memory cell array or reading data from the memory cell array, a voltage generator suitable for generating operation voltages and providing the operation voltages to the address decoder and a controller suitable for controlling the address decoder, the read/write control circuit, and the voltage generator to perform a write operation in response to a write command and a plurality of write data, wherein in the write operation, after the plurality of write data are sequentially programmed in respective resistive memory cells, whether the programmed resistive memory cells are in target resistance levels is verified sequentially.

In an embodiment of the present invention, a processor includes a control unit suitable for generating a control signal in response to a command signal, a calculation unit suitable for performing an operation on data in response to the control signal, and a storage unit comprising a memory cell array having a plurality of resistive memory cells and a controller suitable for performing a write operation to store the data in respective memory cells in response to the control signal, wherein in the write operation, after the data are sequentially programmed in the respective memory cells, whether the programmed memory cells are in target resistance levels is verified sequentially.

In an embodiment of the present invention, a data processing system includes a main controller suitable for decoding a command inputted from an external device to output a control signal, an interface suitable for exchanging the command and data between the external device and the controller, a main memory device suitable for storing applications, control signals, and the data, and an auxiliary memory device suitable for storing program codes or the data, wherein at least one of the main memory device and the auxiliary memory device comprises a memory cell array having a plurality of resistive memory cells and a controller suitable for performing a write operation to store the data in respective memory cells in response to the control signal, and wherein in the write operation, after the data are sequentially programmed in the respective memory cells, whether the programmed memory cells are in target resistance levels is verified sequentially.

In an embodiment of the present invention, an electronic system includes a resistive memory device comprising a memory cell array having a plurality of resistive memory cells and a controller suitable for performing a write operation in response to a write command and a plurality of write data, and a memory controller suitable for accessing a resistive memory device by generating the write command and the plurality of write data in response to a request of an external device, wherein in the write operation, after the plurality of data are sequentially programmed in respective resistive memory cells, whether the programmed resistive memory cells are in target resistance levels is verified sequentially.

In an embodiment of the present invention, there is provided an operating method of a resistive memory device, which includes sequentially programming a plurality of write data in a plurality of resistive memory cells, respectively, and sequentially verifying whether the programmed resistive memory cells are in target resistance levels after the plurality of write data are programmed in the respective memory cells.

BRIEF DESCRIPTION OF THE DRAWINGS

Features, aspects, and embodiments are described in conjunction with the attached drawings, in which:

FIGS. 6A to 7B are diagrams for explaining an average number of PNV operations depending on the operating method of the resistive memory device;

DETAILED DESCRIPTION

Hereinafter, a resistive memory device, an operating method thereof and a system having the same according to the present invention will be described below with reference to the accompanying drawings through exemplary embodiments. Throughout the disclosure, reference numerals correspond directly to the like numbered parts in the various figures and embodiments of the present invention. In addition, a singular form may include a plural form as long as it is not specifically mentioned in a sentence.

Figure 3:
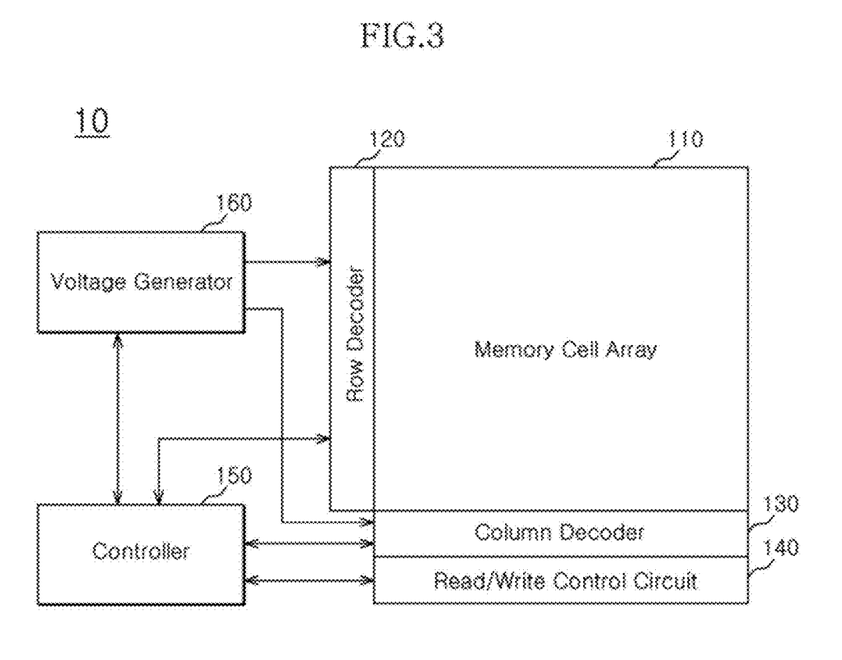
FIG. 3 is a configuration diagram illustrating a resistive memory device according to an embodiment of the present invention.

FIG. 3 is a configuration diagram of a resistive memory device according to an embodiment of the present invention.

The resistive memory device 10 according to the embodiment of the present invention may include a memory cell array 110, a row decoder 120, a column decoder 130, a read/write control circuit 140, a controller 150, and a voltage generator 160.

The memory cell array 110 may be configured by arranging memory cells in array between word lines and bit lines. The resistive memory cell may include a phase change memory cell using chalcogenide, a magnetic memory cell using a magnetic tunneling effect, a resistive memory cell using a transition metal oxide, a polymer memory cell, a memory cell using a perovskite structure, a ferroelectric memory cell using a ferroelectric capacitor and the like, but is not limited thereto. Furthermore, the resistive memory cell may include a multi-level cell (MLC) to store two or more bits of data.

The row decoder 120 and the column decoder 130 are address decoders configured to receive an external address signal. The row decoder 120 and the column decoder 130 may decode the external address signal to a row address and a column address of a memory cell to be accessed within the memory cell array 100, that is, a word line address and a bit line address, respectively, under the control of the controller 150.

The read/write control circuit 140 may receive data from a data input/output circuit block (not illustrated) and write data in the memory cell array 110 under the control of the controller 150 or provide data read from a selected memory cell of the memory cell array 110 to the data input/output circuit block under the control of the controller 150.

The controller 150 may control the row decoder 120, the column decoder 130, and the read/write control circuit 140 to write data in the memory cell array 110 in response to a write command inputted from an external device or host. The write operation may be performed according to a program and verify (PNV) method.

The voltage generator 160 may generate an operation voltage such as a program voltage for write operation, a verify read voltage, or a read voltage for read operation and may provide the generated operation voltage to the row decoder 120, the column decoder 130 and the like, under the control of the controller 150.

In the exemplary embodiment, as a write command, an address, and a plurality of write data are inputted from an external device or host, the controller 150 controls the address decoders 120 and 130 and the read/write control circuit 140 to sequentially program the write data to memory cells, respectively. Furthermore, after the data are programmed to all of the memory cells, verify operations are sequentially performed on the respective memory cells. Thus, a verify operation is performed for each of the memory cells when program and verify operations are performed for memory cells that are programmed before the corresponding memory cell and when only program operation is performed for memory cells programmed after the corresponding memory cell.

The plurality of write data may be divided into one or more data groups. In this case, a write operation may be performed by sequentially performing program operations on memory cells of a data group and sequentially performing verify operations on the respective cells. The write operation may be repetitively performed for each of the data groups.

For example, when (n+1)-bit write data is inputted, program operations may be sequentially performed on memory cells 0 to n, and verify operations may be then sequentially performed on the memory cells 0 to n, respectively. Alternatively, when (n+1)-bit write data is inputted, the data may be divided into two or more groups, and a write operation in which sequential program operations and sequential verify operations are performed may be repetitively performed for each group.

In a general PNV method, a verify operation is performed immediately after a program operation. In a resistive memory cell, however, significant resistance increase may occur due to drift phenomenon immediately after a program operation. In process of time, degree of increasing of resistance is reduced. As shown in Table 1 below, when memory cells 0 to 7 are programmed to fall within a target range of resistance states and a verify read operation is performed at the time t0 immediately after the program operation, data corresponding to the resistance states at the time t0 after the program operation are read as they are programmed. However, when a read command is inputted at the time t1 after a certain time passes and the data of the memory cells 3 to 5 are read, the resistances of the memory cells 3 to 5 are drifted and changed to different resistance states. Thus, during the read operation at the time t1, the data corresponding to the resistance state R1 or R2 are not read from the memory cells 3 to 5, and the read operation fails.

TABLE 1

| memory cell | target resistance state | verified read value (t0) | drifted resistance (t1) | read data (t1) |
|---|---|---|---|---|
| cell 0 | R0 | R0 | R0 | R0 |
| cell 1 | R0 | R0 | R0 | R0 |
| cell 2 | R1 | R1 | R1 | R1 |
| cell 3 | R1 | R1 | R2 | fail |
| cell 4 | R2 | R2 | R3 | fail |
| cell 5 | R2 | R2 | R3 | fail |
| cell 6 | R3 | R3 | R3 | R3 |
| cell 7 | R3 | R3 | R3 | R3 |

The resistance increase due to drift phenomenon significantly occurs immediately after the program operation.

Thus, the controller 150 according to the embodiment of the present invention does not perform a verify read operation immediately after a program operation, but performs a verify read operation after waiting for the initial stage while resistance of a memory cell may be increased, during the PNV operation.

If the controller 150 programs one memory cell and then only waits without any other operations while resistance of the memory cell is increased due to drift, the read/write control circuit 140 has an idle state, and the time required for the write operation of the resistive memory device 10 is inevitably increased. Thus, while the controller 150 waits after programming one memory cell, the controller 150 may perform a program operation for another memory cell. In this way sequential program operations and sequential verify operations may be performed on a plurality of memory cells. That is, since an interleaving operation for another memory cell may be performed during a waiting time for drift, the PNV operation may be performed without significantly increasing the total write time.

When $t_1 = 10^n \cdot t_0$ in Equation 1, Equation 2 below is established.

$$R(t) = R(t_1)\left(\frac{t}{t_1}\right)^v = R(t_1)\left(10^{-n} \cdot \frac{t}{t_0}\right)^v = R(t_1)\left(\frac{10^{-n} \cdot t}{t_0}\right)^v \quad \text{[Equation 2]}$$

Thus, if verify read operation is performed after the time t1 passes from a program operation and $R(t_1)$ is included in the target resistance range, resistance increase due to drift may be reduced by $1/10^n$.

Table 2 shows cell data when a verify read operation is performed at the time $t_1$ after a program operation, during the PNV operation.

TABLE 2

| memory cell | target resistance state | initial program resistance | drifted resistance (t1) | read data for verify(t1) |
|---|---|---|---|---|
| cell 0 | R0 | R0 | R0 | R0 |
| cell 1 | R0 | R0 | R0 | R0 |
| cell 2 | R1 | R1 | R1 | R1 |
| cell 3 | R1 | R0 | R1 | R1 |
| cell 4 | R2 | R1 | R2 | R2 |
| cell 5 | R2 | R1 | R2 | R2 |
| cell 6 | R3 | R3 | R3 | R3 |
| cell 7 | R3 | R3 | R3 | R3 |

During the initial program operation for the PNV operation, the resistance states of the memory cells 3 to 5 do not have a target resistance state. However, while the time approaches the time t1 for the verify read operation, resistance drift occurs so that the resistance states of the memory cells 3, 4, and 5 reach the target resistance state. Finally, the memory cells 3, 4, and 5 may be determined to have the target resistance states at the time t1 at which the verify read operation is performed. Moreover, degree of increasing of resistance due to drift after the time t1 may be substantially mitigated compared to degree of increasing of resistance at the time t0.

Thus, when a time interval between the program operation and the verify read operation is sufficiently secured during the PNV operation, the states of the memory cells may be distinguished through the resistance states after the resistance drift occurs. Thus, the data retention time may be increased.

Figure 4:
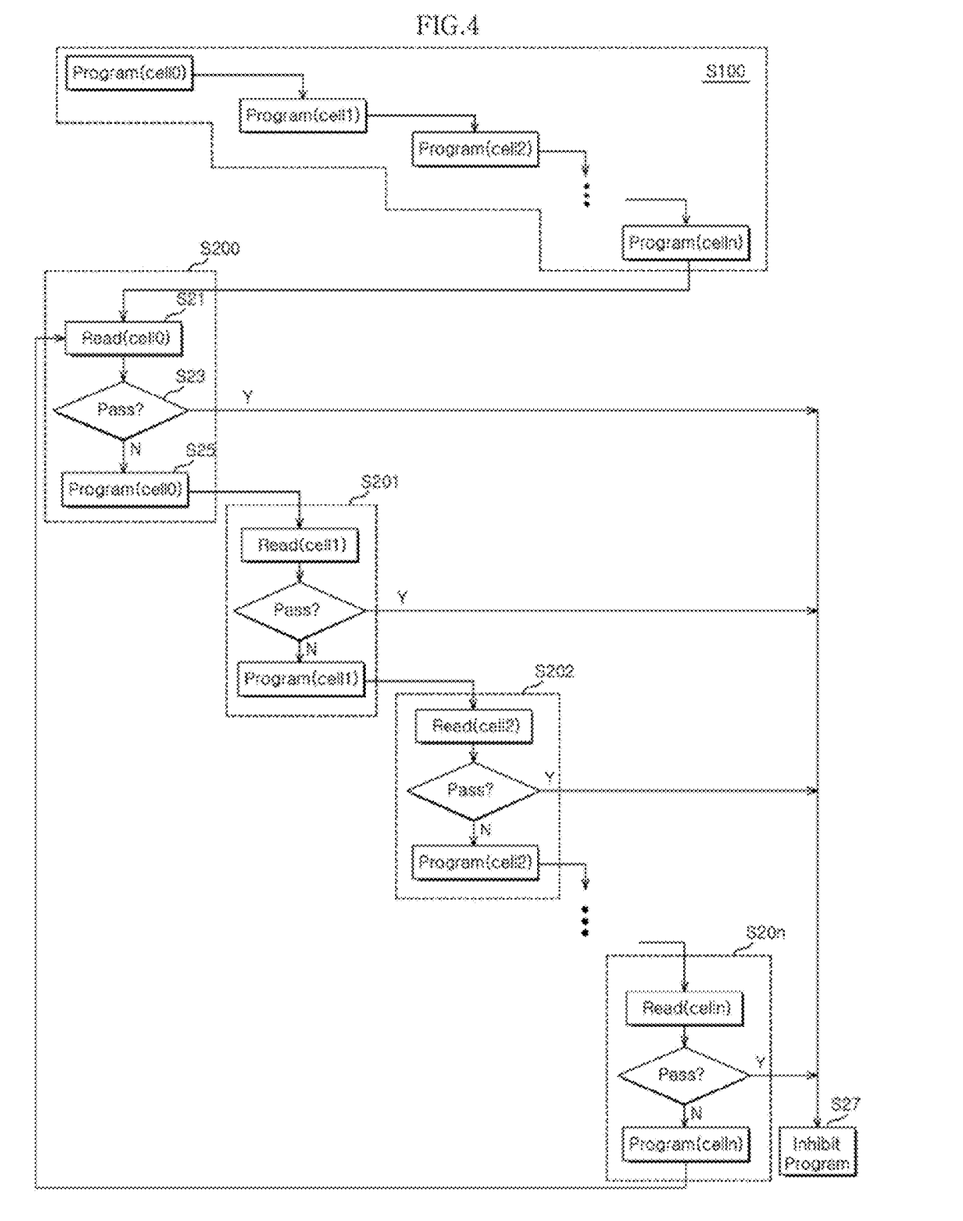
FIG. 4 is a diagram for explaining an operating method of a resistive memory device according to an embodiment of the present invention.

FIG. 4 is a diagram for explaining an operating method of a resistive memory device according to an embodiment of the present invention.

As (n+1)-bit write data are inputted from an external device or host, program operations are sequentially performed on (n+1) memory cells, respectively, at step S100.

For another example, as m*(n+1)-bit write data are inputted from an external device or host, the input write data are divided into a plurality of data groups, for example, m data groups where m is a natural number equal to or more than two, and program operations are sequentially performed on (n+1) memory cells of the first data group, respectively, at step S100.

Then, verify operations are sequentially performed from the first memory cell 0 to the last memory cell n, at steps S200 to S20n.

Each of the verify operations S200 to S20n for the respective memory cells may include performing a verify read operation on a corresponding memory cell at step S21, determining whether the memory cell is in a pass or fail at step S23, reprogramming the failed memory cell at step S25, and setting the passed memory cell as a program-inhibit cell at step S27.

Referring to FIG. 4, the memory cell 0 is not verified but waits until the memory cells 1 to n are programmed, after the memory cell 0 is programmed. Thus, after all of the memory cells 0 to n are programmed, the verify operation for the memory cell 0 is performed at step S200, and the resistance state of the memory cell 0 may be sufficiently drifted in the meantime.

Thus, during the verify read step S21 of the verify operation S200, the data level of the memory cell 0 is read in a state after the resistance is sufficiently drifted, and whether the memory cell 0 is in a pass or not is determined depending on the read data level at step S23. Then, when the memory cell 0 is in a pass, that is, when the memory cell 0 is programmed to a desired resistance state, the memory cell 0 is set in a program inhibition state at step S27. Otherwise, the memory cell 0 is reprogrammed at step S25.

A verify operation S201 for the memory cell 1 is performed in the same manner after the verify operation S200 for the memory cell 0, and verify operations S202 to S20n are sequentially performed on the memory cells 2 to n.

When the verify operation S20n for the memory cell n is completed, verify operations may be performed on the reprogram operations for the memory cells, which were failed during the previous verify operations.

The verify operation for each memory cell is performed after verify operations are performed for memory cells programmed before the corresponding memory cell and before verify operations are performed for memory cells programmed after the corresponding memory cell. Thus, the verify operation is performed in a state where resistance drift is sufficiently reflected after the program operation. That is, the verify operation is not performed during the time immediately after the program operation, in which resistance drift rapidly occurs, but performed after resistance is sufficiently drifted. Since the data level of the memory cell may be distinguished in a state where resistance drift is reflected, the data retention time may be increased.

When m*(n+1)-bit write data are inputted, the data may be divided into m data groups to perform a PNV operation. In this case, the above-described process may be repeated by the number of divided data groups.

Figure 5:
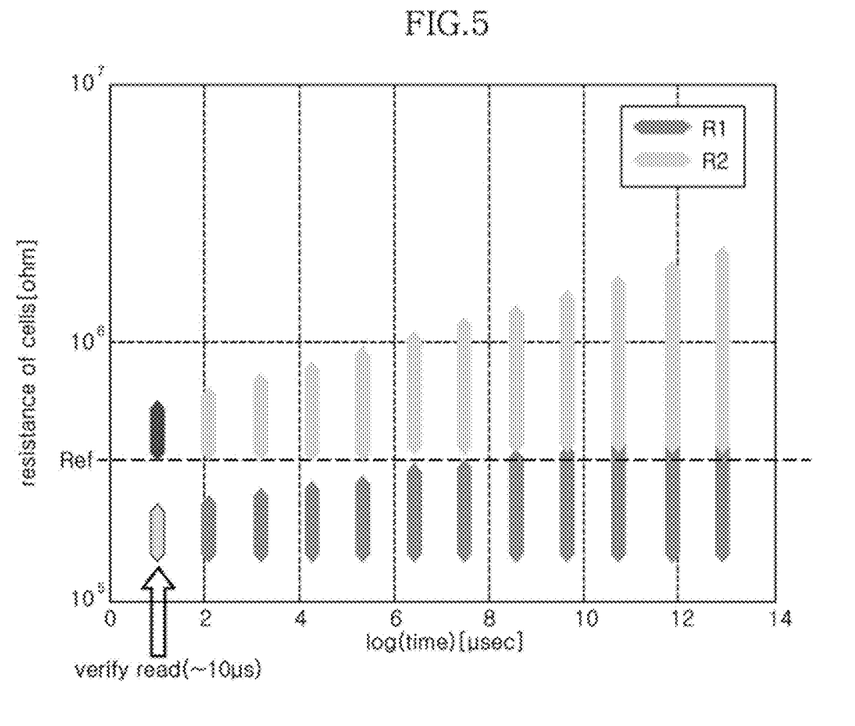
FIG. 5 is a diagram for explaining resistance drift of memory cells in the resistive memory device according to the embodiment of the present invention.

FIG. 5 is a diagram for explaining resistance drift of memory cells in the resistive memory device according to the embodiment of the present invention.

FIG. 5 illustrates a case in which a verify operation is performed in a predetermined time after a program operation, for example, 10 μs, during a PNV operation for a write operation.

Compared to FIG. 1, it can be seen that the data retention time of a memory cell programmed to the target resistance state R1 is increased by 2 orders.

In other words, when a verify read operation is performed at the time at which 125 ns passes after a program operation as illustrated in FIG. 1, the resistance of the memory cell programmed to the resistance state R1 exceeds the reference resistance Ref after 6 μs converted by log-scaling, to cause a fail. In the present embodiment, however, a verify read operation is performed after a predetermined waiting time from a program operation. Thus, the resistance of the memory cell exceeds the reference resistance Ref after 8 μs converted by log-scaling. Therefore, the data retention time may be secured by 2 orders compared to the conventional resistive memory device.

FIGS. 6A to 7B are diagrams for explaining an average number of PNV operations depending on the operating method of the resistive memory device.

Figure 6A:
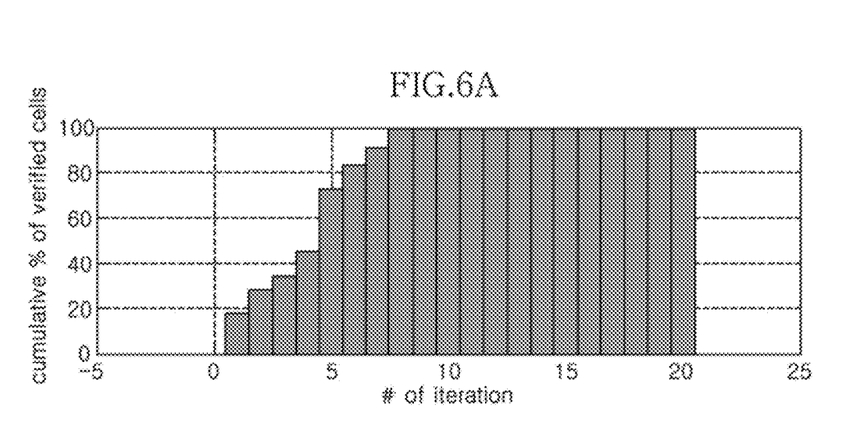
Figure 6B:
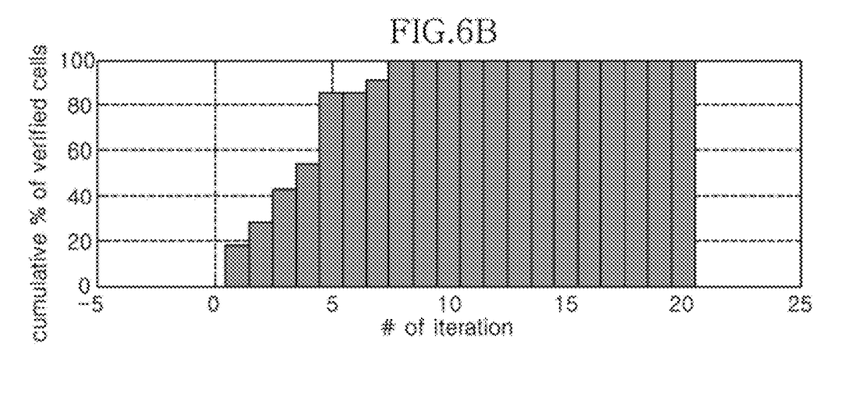

FIGS. 6A and 6B are diagrams for explaining an average number of PNV operations in the conventional resistive memory device. FIG. 6A illustrates an average number of PNV operations for memory cells to be programmed to the low resistance state R1, and the average number is 4.2707. FIG. 6B illustrates an average number of PNV operations for memory cells to be programmed to the high resistance state R2, and the average number is 3.9935.

Figure 7A:
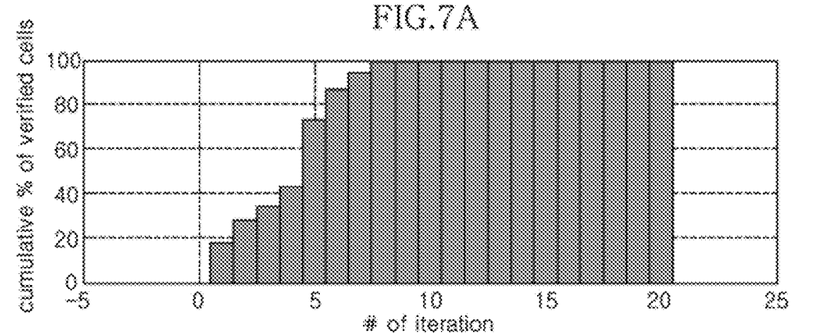
Figure 7B:
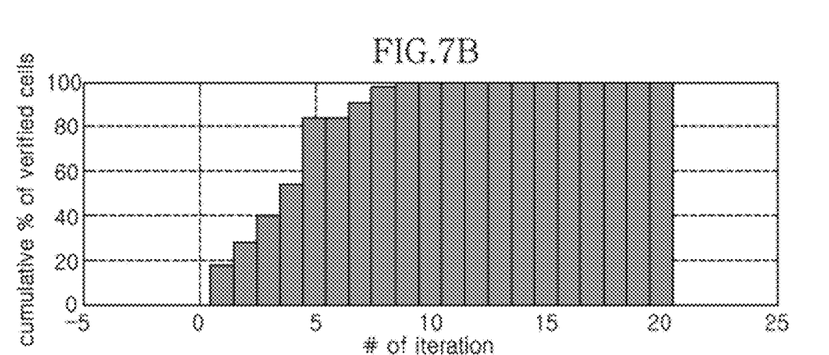

FIGS. 7A and 7B are diagrams for explaining an average number of PNV operations in the resistive memory device according to the embodiment of the present invention. FIG. 7A illustrates an average number of PNV operations for memory cells to be programmed to the low resistance state R1, and the average number is 4.1756. FIG. 7B illustrates an average number of PNV operations for memory cells to be programmed to the high resistance state R2, and the average number is 4.0696.

As illustrated in FIGS. 6A to 7B, even when a verify operation is performed in a predetermined time after a program operation according to the embodiment of the present invention, a write operation may performed without increasing the PNV number more than the conventional resistive memory device. That is the data retention time may be increased while the performance of the resistive memory device is maintained.

Figure 8:
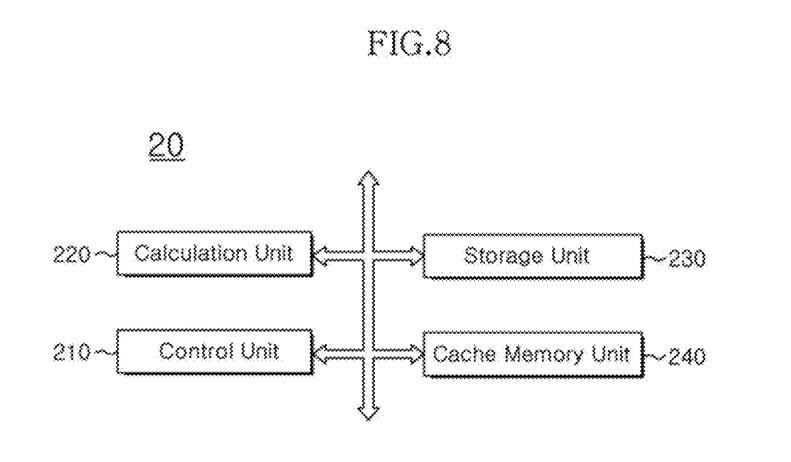
FIG. 8 is a configuration diagram illustrating a processor according to an embodiment of the present invention.

FIG. 8 is a configuration diagram illustrating a processor according to an embodiment of the present invention.

Referring to FIG. 8, the processor 20 may include a control unit 210, a calculation unit 220, a storage unit 230, and a cache memory unit 240.

The control unit 210 is configured to receive a signal such as a command or data from an external device, and decode the command or input, output, or process the data. That is, the control unit 210 controls overall operations of the processor 20.

The calculation unit 220 is configured to perform various calculation operations according to the decoding result of the control unit. The calculation unit 220 may include one or more arithmetic and logic units (ALU).

The storage unit 230 may serve as a register and is configured to store data in the processor 20. The storage unit 230 may include a data register, an address register, a floating point register, and various other registers. The storage unit 230 may store data to be calculated by the calculation unit 220, calculation result data, and addresses at which those data are stored.

The storage unit 230 may include a memory cell array including resistive memory cells, an address decoder, a controller, a voltage generator and the like. In one embodiment of the present invention, the storage unit 230 may include the resistive memory device of FIG. 3. Thus, as a write command and a plurality of write data are inputted from the controller 210, the storage unit 230 sequentially programs the data to memory cells, respectively. Then, after the data are programmed to the respective memory cells, verify operations are sequentially performed on the respective memory cells. The plurality of write data may be divided into one or more data groups. In this case, a write operation may be performed by sequentially programming memory cells and sequentially verifying the memory cells for a data group. The write operation may be repetitively performed for each data group.

The cache memory unit 240 serves as a temporary storage space.

The processor 20 illustrated in FIG. 8 may serve as a central processing unit (CPU), a graphic processing unit (GPU), a digital signal processor (DSP), an application processor (AP) or the like of an electronic device.

Figure 9:
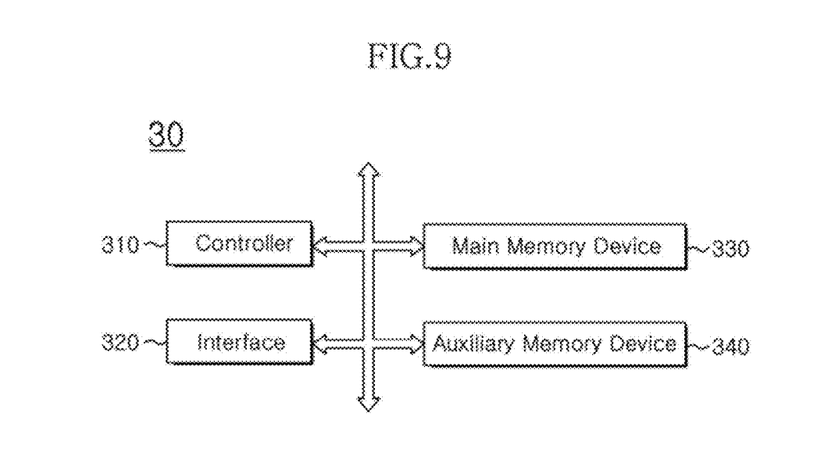
FIGS. 9 and 10 are configuration diagrams illustrating a data processing system according to an embodiment of the present invention.
Figure 10:
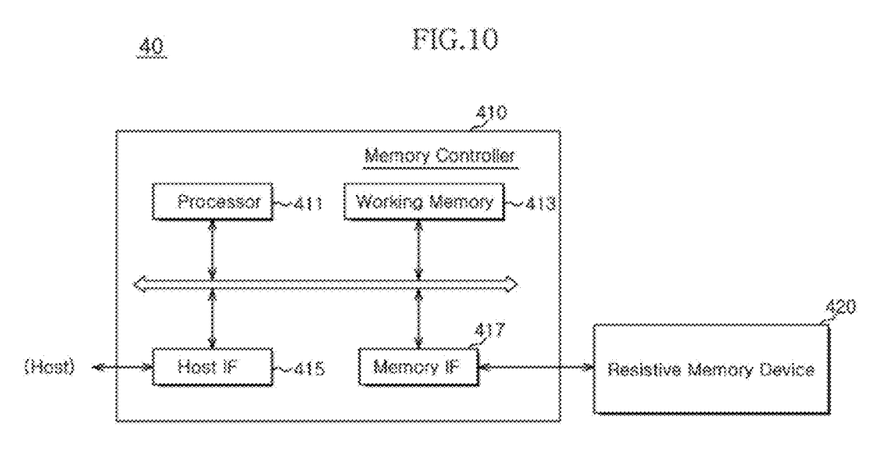

FIGS. 9 and 10 are configuration diagrams illustrating a data processing system according to an embodiment of the present invention.

The data processing system 30 illustrated in FIG. 9 may include a main controller 310, an interface 320, a main memory device 330, and an auxiliary memory device 340.

The data processing system 30 may perform an input, processing, output, communication, or storage operation, in order to perform a series of operations of processing data. The data processing system 30 may serve as an electronic device such as a computer server, a portable terminal, a portable computer, a web tablet computer, wireless terminal, a mobile communication terminal, a digital contents player, a camera, a global positioning system (GPS), a video camera, a recorder, a telematics device, an AV system, a smart TV or the like.

In another embodiment, the data processing system 30 may serve as a data storage device, and may be configured in a disk type such as a hard disk, an optical disk, a solid state disk, DVD or the like or a card type such as a universal serial bus (USB) memory, a secure digital (SD) card, a memory stick, an internal/external multimedia card, a smart media card, a compact flash card or the like.

The main controller 310 is configured to control data exchange through the main memory device 330 and the interface 320. For this operation, the main controller 310 controls overall operations of decoding commands inputted through the interface 320 from an external device and calculating and comparing data stored in the system.

The interface 320 is configured to provide an environment in which commands and data are exchanged between an external device and the data processing system 30. The interface 320 may serve as a man-machine interface device, a card interface device, or a disk interface device depending on the applied environment of the data processing system. The man-machine interface device may include an input device such as keyboard, keypad, mouse, or voice recognition device and an output device such as display or speaker. The disk interface device may include IDE (Integrated Drive Electronics), SCSI (Small Computer System Interface), SATA (Serial Advanced Technology Attachment), eSATA (External SATA), PCMCIA (Personal Computer Memory Card International Association) and the like.

The main memory device 330 is configured to store applications, control signals, and data, which are required for operating the data processing system 30. The main memory device 330 serves as a storage space in which program codes or data are transferred from the auxiliary memory device 340 and then executed. The main memory device 330 may be implemented with a memory device having nonvolatile properties. For example, the resistive memory device illustrated in FIG. 3 may be used as the main memory device 330.

The auxiliary memory device 340 is a space for storing program codes or data, and may include a high-capacity memory device. For example, the resistive memory device illustrated in FIG. 3 may be used as the auxiliary memory device 340.

That is, the main memory device 330 and/or the auxiliary memory device 340 may include a memory cell arrays having resistive memory cells, an address decoder, a controller, a voltage generator and the like, for example. Thus, as a write command and a plurality of write data are inputted from the main controller 310, the main memory device 330 and/or the auxiliary memory device 340 sequentially program data to memory cells, respectively. Then, after the data are programmed to the respective memory cells, verify operations are sequentially performed on the respective memory cells. The plurality of write data may be divided into one or more data groups. In this case, a write operation may be performed by sequentially programming memory cells and sequentially verifying the memory cells for a data group. The write operation may be repetitively performed for each data group.

The data processing system 40 illustrated in FIG. 10 may include a memory controller 410 and a resistive memory device 420.

The memory controller 410 may access the resistive memory device 420 in response to a request of a host. For this operation, the memory controller 410 may include a processor 411, a working memory 413, a host interface 415, and a memory interface 417.

The processor 411 may control overall operations of the memory controller 410, and the working memory 413 may store applications, data, control signals and the like, which are required for operating the memory controller 410.

The host interface 415 may perform protocol conversion for exchanging data/control signals between the host and the memory controller 410, and the memory interface 417 may perform protocol conversion for exchanging data/control signals between the memory controller 410 and the resistive memory device 420.

For example, the resistive memory device of FIG. 3 may be used as the resistive memory device 420. The resistive memory device 420 may include a memory cell array having resistive memory cells, an address decoder, a controller, a voltage generator and the like. Thus, as a write command and a plurality of write data are inputted from the memory controller 410, the resistive memory device 420 sequentially programs data to memory cells, respectively. Then, after the data are programmed to the respective memory cells, verify operations are sequentially performed on the respective memory cells. The plurality of write data may be divided into one or more data groups. In this case, a write operation may be performed by sequentially programming memory cells and sequentially verifying the memory cells for a data group. The write operation may be repetitively performed for each data group.

The data processing system illustrated in FIG. 10 may be utilized as a disk device, an internal/external memory card of a portable electronic device, an image processor, or other application chip sets.

Furthermore, the working memory 413 provided in the memory controller 410 may also be implemented with the memory device of FIG. 3.

Figure 11:
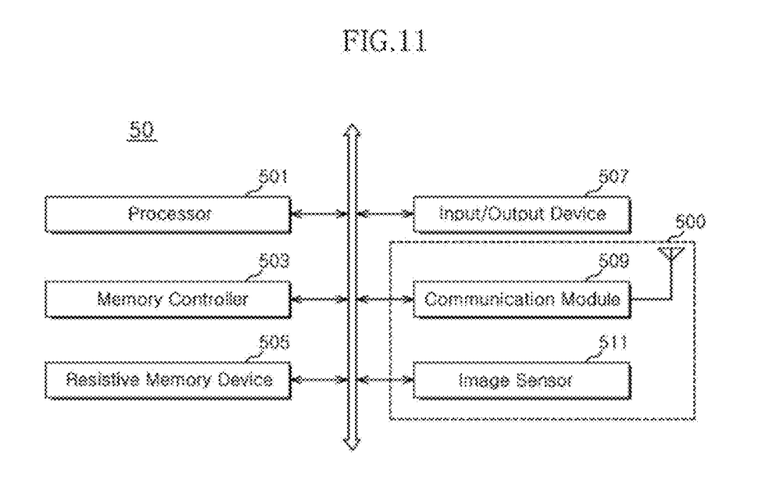
FIGS. 11 and 12 are configuration diagrams illustrating electronic systems according to embodiments of the present invention.
Figure 12:
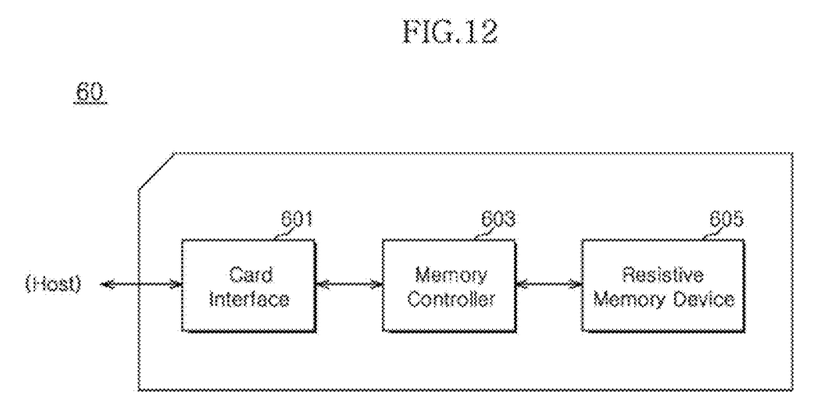

FIGS. 11 and 12 are configuration diagrams illustrating electronic systems according to embodiments of the present invention.

The electronic system 50 illustrated in FIG. 11 may include a processor 501, a memory controller 503, a resistive memory device 505, an input/output device 507, and a function module 500.

The memory controller 503 may control a data processing operation of the resistive memory operation 505, for example, a program or read operation, under the control of the processor 501.

Data programmed to the resistive memory device 505 may be outputted through the input/output device 507 under the control of the processor 501 and the memory controller 503. For this operation, the input/output device 507 may include a display device, a speaker device and the like.

The input/output device 507 may also include an input device through which a control signal for controlling the operation of the processor 501 or data to be processed by the processor 501 may be inputted.

In another embodiment, the memory controller 503 may be implemented as a part of the processor 501 or a chip set separate from the processor 501.

The resistive memory device 505 may include a memory cell array having resistive memory cells, an address decoder, a controller, a voltage generator and the like. Thus, as a write command and a plurality of write data are inputted from the memory controller 503, the resistive memory device 505 sequentially programs data to memory cells, respectively. Then, after the data are programmed to the respective memory cells, verify operations are sequentially performed on the respective memory cells. The plurality of write data may be divided into one or more data groups. In this case, a write operation may be performed by sequentially programming memory cells and sequentially verifying the memory cells for a data group. The write operation may be repetitively performed for each data group.

The function module 500 may include a module configured to perform a selected function depending on an applied example of the electronic system 50 of FIG. 11. FIG. 11 illustrates a communication module 509 and an image sensor 511 as an example of the function module 500.

The communication module 509 may provide a communication environment in which the electronic system 50 accesses a wired or wireless communication network to exchange data and control signals.

The image sensor 511 may convert an optical image into digital image signals and may transmit the digital image signals to the processor 501 and the memory controller 503.

When the electronic system 50 of FIG. 11 is provided with the communication module 509, the electronic system 50 may operate as a portable communication device such as a wireless communication terminal. When the electronic system 50 is provided with the image sensor 511, the electronic system 50 may operate as an electronic system having a digital camera or a digital camcorder, for example, a PC, a notebook computer, a mobile communication terminal or the like, The electronic system 60 illustrated in FIG. 12 may include a card interface 601, a memory controller 603, and a resistive memory device 605.

FIG. 12 illustrates an example of a memory card or smart card, and the electronic system 60 may include any one of a PC card, a multimedia card, an embedded multimedia card, a secure digital card, and a USB drive.

The card interface 601 is configured to interface a host and the memory controller 603 for the data exchange depending on a protocol of the host. In one embodiment, the card interface 601 may indicate hardware capable of supporting the protocol used by the host, software mounted on the hardware to support the protocol used by the host, or a signal transmission scheme.

The memory controller 603 is configured to control data exchange between the resistive memory device 605 and the card interface 601.

For example, the memory device of FIG. 3 may be used as the resistive memory device 605. That is, the resistive memory device 605 may include a memory cell array having resistive memory cells, an address decoder, a controller, a voltage generator and the like. Thus, as a write command and a plurality of write data are inputted from the memory controller 603, the resistive memory device 605 sequentially programs data to memory cells, respectively. Then, after the data are programmed to the respective memory cells, verify operations are sequentially performed on the respective memory cells. The plurality of write data may be divided into one or more data groups. In this case, a write operation may be performed by sequentially programming memory cells and sequentially verifying the memory cells for a data group. The write operation may be repetitively performed for each data group.

While certain embodiments have been described above, it will be understood to those skilled in the art that the embodiments described are by way of example only. Accordingly, the resistive memory device described herein should not be limited based on the described embodiments. Rather, the resistive memory device described herein should only be limited in light of the claims that follow.

What is claimed is:

1. A resistive memory device comprising:
   a memory cell array comprising a plurality of resistive memory cells;
   an address decoder suitable for decoding an address signal and selecting the resistive memory cells;
   a read/write control circuit suitable for programming data to the memory cell array or reading data from the memory cell array;
   a voltage generator suitable for generating operation voltages and providing the operation voltages to the address decoder; and
   a controller suitable for controlling the address decoder, the read/write control circuit, and the voltage generator to perform a write operation for target memory cells in response to a write command and a plurality of write data,
   wherein, while the controller waits after programming one memory cell of the target memory cells, the controller performs a program operation for another memory cell of the target memory cells, and then performs verification operations, for verifying whether the programmed target memory cells are in target resistance levels, on the programmed target memory cells in accordance with programmed sequence of the target memory cells when all the plurality of write data are programmed in the target memory cells.

2. The resistive memory device according to claim 1, wherein a verify operation for one of the programmed memory cells is performed after verify operations are performed for memory cells programmed before the memory cell and before verify operations are performed for memory cells programmed after the memory cell.

3. The resistive memory device according to claim 1, wherein the controller divides the plurality of write data into one or more data groups, performs the write operation for memory cells of a first data group, and repeats the write operation for the data groups by the number of data groups.

4. The resistive memory device according to claim 1, wherein the resistive memory cell comprises a memory cell of which resistance increases after the memory cell is programmed.

5. The resistive memory device according to claim 1, wherein the resistive memory cell comprises a phase change memory cell.

6. The resistive memory device according to claim 1, wherein the resistive memory cell comprises a memory cell to store two or more bits of data.

7. A processor comprising:
a control unit suitable for generating a control signal in response to a command signal;
a calculation unit suitable for performing an operation on data in response to the control signal; and
a storage unit comprising a memory cell array having a plurality of resistive memory cells and a controller suitable for performing a write operation to store the data for target memory cells in response to the control signal,
wherein, while the controller waits after programming one memory cell of the target memory cells, the controller performs a program operation for another memory cell of the target memory cells, and then performs verification operations, for verifying whether the programmed target memory cells are in target resistance levels, on the programmed target memory cells in accordance with programmed sequence of the target memory cells when all the data are programmed in the target memory cells.

8. The processor according to claim 7, wherein the controller divides the data into one or more data groups, performs the write operation for memory cells of a first data group, and repeats the write operation for the data groups by the number of data groups.

9. A data processing system comprising:
a main controller suitable for decoding a command inputted from an external device to output a control signal;
an interface suitable for exchanging the command and data between the external device and the main controller;
a main memory device suitable for storing applications, control signals, and the data; and
an auxiliary memory device suitable for storing program codes or the data,
wherein at least one of the main memory device and the auxiliary memory device comprises a memory cell array having a plurality of resistive memory cells and a controller suitable for performing a write operation to store the data for target memory cells in response to the control signal, and
wherein, while the controller waits after programming one memory cell of the target memory cells, the controller performs a program operation for another memory cell of the target memory cells, and then performs verification operations, for verifying whether the programmed target memory cells are in target resistance levels, on the programmed target memory cells in accordance with programmed sequence of the target memory cells when all the data are programmed in the target memory cells.

10. The data processing system according to claim 9, wherein the controller divides the data into one or more data groups, performs the write operation for memory cells of a first data group, and repeats the write operation for the data groups by the number of data groups.

11. The data processing system according to claim 9, wherein the interface comprises one of a man-machine interface device, a card interface device, and a disk interface device.

12. An electronic system comprising:
a resistive memory device comprises a memory cell array having a plurality of resistive memory cells and a controller suitable for performing a write operation for target memory cells in response to a write command and a plurality of write data; and
a memory controller suitable for accessing the resistive memory device by generating the write command and the plurality of write data in response to a request of an external device,
wherein, while the controller waits after programming one memory cell of the target memory cells, the controller performs a program operation for another memory cell of the target memory cells, and then performs verification operations, for verifying whether the programmed target memory cells are in target resistance levels, on the programmed target memory cells in accordance with programmed sequence of the target memory cells when all the plurality of write data are programmed in the target memory cells.

13. The electronic system according to claim 12, wherein the controller divides the plurality of write data into one or more data groups, performs the write operation for memory cells of a first data group, and repeats the write operation for the data groups by the number of data groups.

14. The electronic system according to claim 12, wherein the memory controller comprises:
a processor suitable for decoding a command from a host as the external device;
a working memory suitable for storing applications, data, and control signals used for operating the memory controller;
a host interface suitable for performing protocol conversion for exchanging data and control signals between the host and the memory controller; and
a memory interface suitable for performing protocol conversion for exchanging data and signals between the memory controller and the resistive memory device.

15. The electronic system according to claim 12, wherein the memory controller comprises:
a processor suitable for decoding a command inputted from the external device;
a working memory suitable for storing applications, data, and control signals used for operating the processor; and
a user interface suitable for providing a data input/output environment between the processor and the external device.

16. The electronic system according to claim 15, further comprising a communication module suitable for accessing a wired or wireless communication network.

17. The electronic system according to claim 15, further comprising an image sensor suitable for converting an optical image into an image signal and transmitting the image signal to the processor.

18. An operating method of a resistive memory, comprising:
  sequentially programming a plurality of write data in a plurality of resistive memory cells, respectively, wherein, while waiting after programming one memory cell of the resistive memory cells, a program operation for another memory cell of the resistive memory cells is performed; and
  sequentially performing verification operations, for verifying whether the programmed resistive memory cells are in target resistance levels, on the programmed resistive memory cells in accordance with programmed sequence of the resistive memory cells when all the plurality of write data are programmed in the respective resistive memory cells.

19. The operating method according to claim 18, wherein when the plurality of write data are divided into one or more data groups, the sequential programming and verifying are performed and repeated for each of the data groups.

20. The operating method according to claim 18, wherein in the sequential programming of the write data, the memory cells are programmed to have resistance levels less than the target resistance levels.

* * * * *